USO12483199B2

(12) United States Patent
Yu et al.

(10) Patent No.: US 12,483,199 B2
(45) Date of Patent: Nov. 25, 2025

(54) AMPLIFIER CIRCUIT HAVING LOW PARASITIC POLE EFFECT AND BUFFER CIRCUIT THEREOF

(71) Applicant: Richtek Technology Corporation, Zhubei (TW)

(72) Inventors: Chun-Jen Yu, Taoyuan (TW); Ssu-Wei Huang, Taichung (TW); Hsuan-Kai Wang, Taoyuan (TW); Chi-Jen Yang, Hsinchu (TW); Hsien-Chih She, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 496 days.

(21) Appl. No.: 18/056,329

(22) Filed: Nov. 17, 2022

(65) Prior Publication Data

US 2023/0198473 A1 Jun. 22, 2023

Related U.S. Application Data

(60) Provisional application No. 63/290,648, filed on Dec. 16, 2021.

(30) Foreign Application Priority Data

Sep. 30, 2022 (TW) .................................. 111137336

(51) Int. Cl.
*H03F 1/08* (2006.01)
*H03F 1/14* (2006.01)
*H03F 1/42* (2006.01)

(52) U.S. Cl.
CPC ................. *H03F 1/14* (2013.01); *H03F 1/42* (2013.01); *H03F 2200/222* (2013.01)

(58) Field of Classification Search
CPC ........ H03F 1/14; H03F 1/42; H03F 2200/222; H03F 2203/5012; H03F 3/505; H03F 3/345; G05F 1/575
USPC .......................................................... 330/76
See application file for complete search history.

(56) References Cited

U.S. PATENT DOCUMENTS 9,946,283 B1 * 4/2018 Yung ........................ G05F 1/575

* cited by examiner

*Primary Examiner* — Andrea Lindgren Baltzell
*Assistant Examiner* — Khiem D Nguyen
(74) *Attorney, Agent, or Firm* — Tung & Associates (57) ABSTRACT

An amplifier circuit having low parasitic pole effect includes a preamplifier, an output transistor and a buffer circuit. The buffer circuit generates a driving signal to control the output transistor according to a preamplification signal generated by the preamplifier. The buffer circuit includes: a buffer input transistor generating the driving signal, wherein an input impedance at its control end is less than that of the output transistor; a low output impedance circuit having an output impedance which is less than an inverting output impedance of the buffer input transistor; an amplification transistor generating an amplification signal at its inverting output; and an amplification stage circuit amplifying the amplification signal by an amplification ratio, so that an equivalent output impedance at a non-inverting output of the buffer input transistor is less than or equal to a product of the reciprocal of an intrinsic output impedance thereof and an amplification ratio.

19 Claims, 6 Drawing Sheets

AMPLIFIER CIRCUIT HAVING LOW PARASITIC POLE EFFECT AND BUFFER CIRCUIT THEREOF

CROSS REFERENCE

The present invention claims priority to U.S. 63/290,648 filed on Dec. 16, 2021 and claims priority to TW 111137336 filed on Sep. 30, 2022.

BACKGROUND OF THE INVENTION

Field of Invention

The present invention relates to an amplifier circuit, in particular to an amplifier circuit having low parasitic pole effect. The present invention also relates to a buffer circuit for reducing parasitic pole effect.

Description of Related Art

Figure 1:
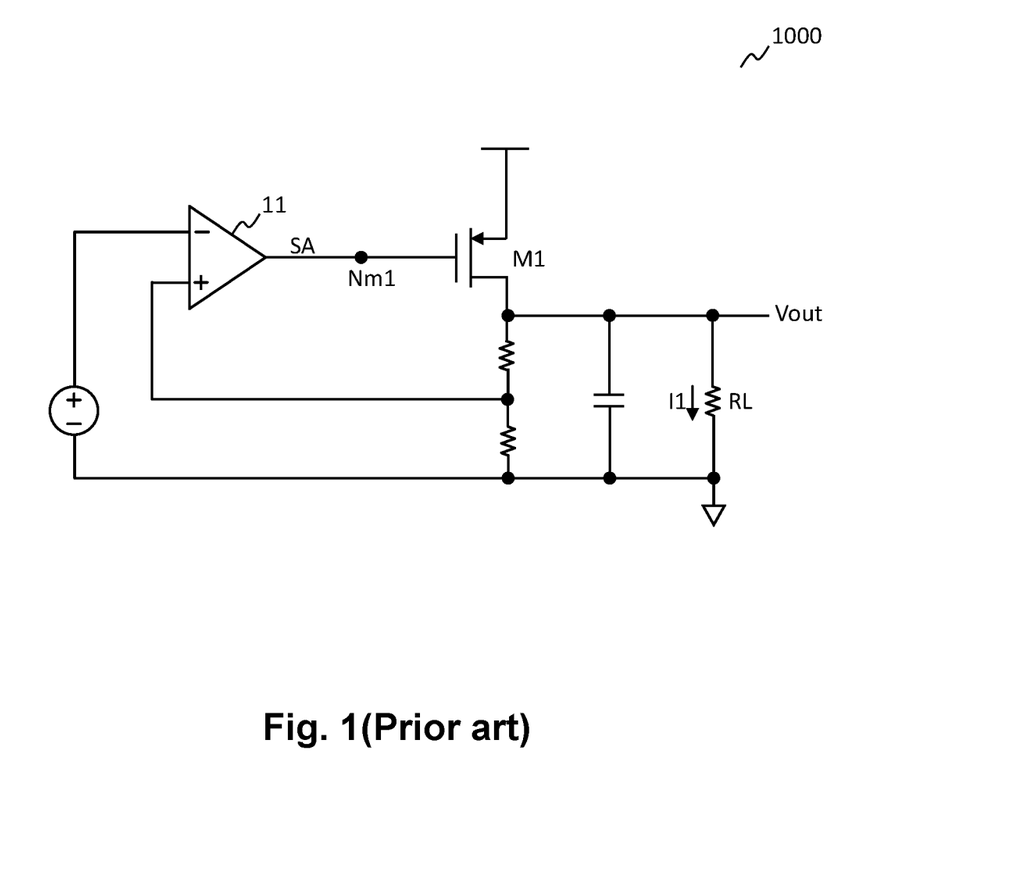
FIG. 1 shows a prior art low-dropout regulator.

Please refer to FIG. 1. FIG. 1 shows a prior art low-dropout regulator (LDO). As shown in FIG. 1, in the low-dropout regulator 1000, the amplifier 11 generates an amplified signal SA to adjust the output voltage Vout according to the input signal and the feedback loop. The amplified signal SA is provided to drive a transistor M1; when the load RL requires a large current I1, the device size of transistor M1 needs to be large enough so as to generate a sufficiently large drain current to produce the large current I1 required by the load RL. However, this conventional art has disadvantages that: in order to provide the output voltage Vout with high accuracy, the amplifier 11 needs to have a high gain, and thus its output resistance is also large (because the gain is proportional to the product of the conductance of the amplifier 11 and the output resistance of the amplifier 11). Furthermore, since the device size of the transistor M1 is large, the gate capacitance (input capacitance) of the transistor M1 is also large. When the low-dropout regulator 1000 is a multi-pole system, due to the large output resistance of the amplifier 11 and the high input capacitance of the transistor M1, a relatively high pole effect will be generated at the node Nm1 (that is, a lower pole frequency is generated), resulting in problems such as poor stability of the low-dropout regulator 1000, difficult compensation, and poor system transient response.

Compared with the aforementioned conventional art, the amplifier circuit having low parasitic pole effect of the present invention, by the design of the buffer circuit therein, can effectively reduce the parasitic pole effect, and further have the advantages of high bandwidth and high power supply rejection ratio (PSRR), to achieve high system stability.

SUMMARY OF THE INVENTION

From one perspective, the present invention provides an amplifier circuit having low parasitic pole effect, comprising: a pre-amplifier, configured to generate a pre-amplified signal according to an input signal; an output transistor, configured to generate an output signal according to a driving signal applied to a control end of the output transistor; and a buffer circuit, configured to generate the driving signal according to the pre-amplified signal, wherein the buffer circuit comprises: a buffer input transistor, configured as a non-inverted follower, wherein a control end of the buffer input transistor is controlled by the pre-amplified signal to generate the driving signal at a non-inverted output end of the buffer input transistor and to generate an inverted control signal at an inverted output end of the buffer input transistor, and an input impedance of the control end of the buffer input transistor is less than an input impedance of the control end of the output transistor; a first low output impedance circuit coupled to an inverted output end of the buffer input transistor, wherein an output impedance of the first low output impedance circuit is less than an output impedance of the inverted output end of the buffer input transistor; a first amplifier transistor controlled by the inverted control signal to generate a first amplified signal at an inverted output end of the first amplifier transistor; and an amplifier stage circuit, configured to amplify the first amplified signal to generate a second amplified signal, wherein a magnification ratio exists between the second amplified signal and the inverted control signal, wherein the second amplified signal is coupled to the driving signal, so that an equivalent output impedance of the non-inverted output end of the buffer input transistor is less than or equal to a product of an intrinsic output impedance of the non-inverted output end of the buffer input transistor and a reciprocal of the magnification ratio.

In one embodiment, a gate capacitance of the buffer input transistor is less than a gate capacitance of the output transistor.

In one embodiment, the gate capacitance of the buffer input transistor is less than one percent of the gate capacitance of the output transistor.

In one embodiment, the first low output impedance circuit is a transistor coupled as a diode.

In one embodiment, the first amplifier transistor is a metal-oxide-semiconductor (MOS) transistor or a bipolar junction transistor (BJT).

In one embodiment, the buffer circuit further comprises a second amplifier transistor, wherein the second amplifier transistor and the first amplifier transistor are of the same conductivity type or complementary conductivity types, and the first amplifier transistor and the second amplifier transistor are coupled as a Darlington pair of the same type or a hetero-Darlington pair.

In one embodiment, the amplifier stage circuit comprises an even number of inverted amplifier transistors connected in series with each other.

In one embodiment, the buffer circuit further comprises a second low output impedance circuit coupled to the inverted output end of the first amplifier transistor, and an output impedance of the second low output impedance circuit is less than an intrinsic output impedance of the inverted output end of the first amplifier transistor.

In one embodiment, the second low output impedance circuit is a transistor coupled as a diode.

In one embodiment, the buffer circuit further comprises a first current source circuit and a second current source circuit which are configured to bias the buffer input transistor, wherein the first current source circuit adjusts a current level of the first current source circuit according to a transient change of the output signal, so as to accelerate a transient response of the buffer circuit.

In one embodiment, when the first current source circuit adjusts the current level of the first current source circuit to increase according to the transient change of the output signal, the output impedance of the first low output impedance circuit is further reduced, thereby accelerating the transient response and improving a stability of the amplifier circuit having low parasitic pole effect during a transient state.

From another perspective, the present invention provides a buffer circuit for reducing the parasitic pole effect of an amplifier circuit, configured to generate a driving signal according to a pre-amplified signal generated by a pre-amplifier of the amplifier circuit, wherein the driving signal is configured to control a control end of an output transistor of the amplifier circuit to generate an output signal, wherein the buffer circuit comprises: a buffer input transistor, configured as a non-inverted follower, wherein a control end of the buffer input transistor is controlled by the pre-amplified signal to generate the driving signal at a non-inverted output end of the buffer input transistor and to generate an inverted control signal at an inverted output end of the buffer input transistor, and an input impedance of the control end of the buffer input transistor is less than an input impedance of the control end of the output transistor; a first low output impedance circuit coupled to an inverted output end of the buffer input transistor, wherein an output impedance of the first low output impedance circuit is less than an intrinsic output impedance of the inverted output end of the buffer input transistor; a first amplifier transistor controlled by the inverted control signal to generate a first amplified signal at an inverted output end of the first amplifier transistor; and an amplifier stage circuit, configured to amplify the first amplified signal to generate a second amplified signal, wherein a magnification ratio exists between the second amplified signal and the inverted control signal, wherein the second amplified signal is coupled to the driving signal, so that an equivalent output impedance of the non-inverted output end of the buffer input transistor is less than or equal to a product of an intrinsic output impedance of the non-inverted output end of the buffer input transistor and a reciprocal of the magnification ratio.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
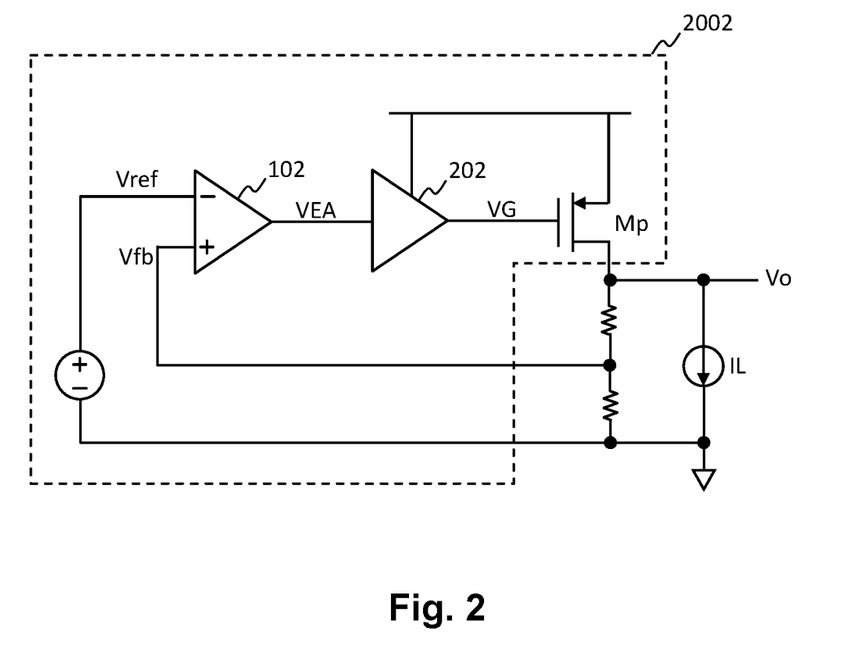
FIG. 2 shows a block diagram of an amplifier circuit having low parasitic pole effect according to an embodiment of the present invention.

Please refer to FIG. 2. FIG. 2 shows a block diagram (amplifier circuit 2002) of an amplifier circuit having low parasitic pole effect according to an embodiment of the present invention. In one embodiment, the amplifier circuit 2002 includes: a pre-amplifier 102, an output transistor Mp, and a buffer circuit 202. In one embodiment, the pre-amplifier 102 is configured to generate a pre-amplified signal VEA according to an input signal, wherein the feedback signal Vfb can be regarded as the input signal, or both the feedback signal Vfb and the reference signal Vref can be regarded as the input signals, and the pre-amplifier 102 generates the pre-amplified signal VEA according to a difference between the feedback signal Vfb and the reference signal Vref. The buffer circuit 202 is configured to generate a driving signal VG according to the pre-amplified signal VEA. The output transistor Mp is configured to generate an output signal Vo according to the driving signal VG which is applied to the control end of the output transistor Mp, wherein the device size of the output transistor Mp is sufficiently large to meet the large current required by the load IL, so the output transistor Mp has a relatively large input capacitance. The buffer circuit 202 has the characteristics of lower input capacitance relative to the input capacitance of the output transistor Mp and lower output impedance relative to the output impedance of the pre-amplifier 102. Therefore, by the buffer circuit 202, the amplifier circuit 2002 can make an equivalent impedance at the output end of the pre-amplifier 102 to match (i.e. to cooperate) with the relatively low input capacitance of the buffer circuit 202, so that a relatively low pole effect is formed between the output end of the pre-amplifier 102 and the input end of the buffer circuit 202. In addition, the amplifier circuit 2002 can make the large input capacitance at the control end of the output transistor Mp to match (i.e. to cooperate) with the relatively low output resistance of the buffer circuit 202 to form a relatively low pole effect between the control end of the output transistor Mp and the output end of the buffer circuit 202. Furthermore, the parasitic pole effect is positively correlated with the product of the capacitance and the resistance, and the parasitic pole effect is negatively correlated with the bandwidth. Therefore, by the configuration of the buffer circuit 202, the parasitic pole effect of the amplifier circuit 2002 can be greatly reduced; the bandwidth can be increased; and the system stability can be improved.

Figure 3A:
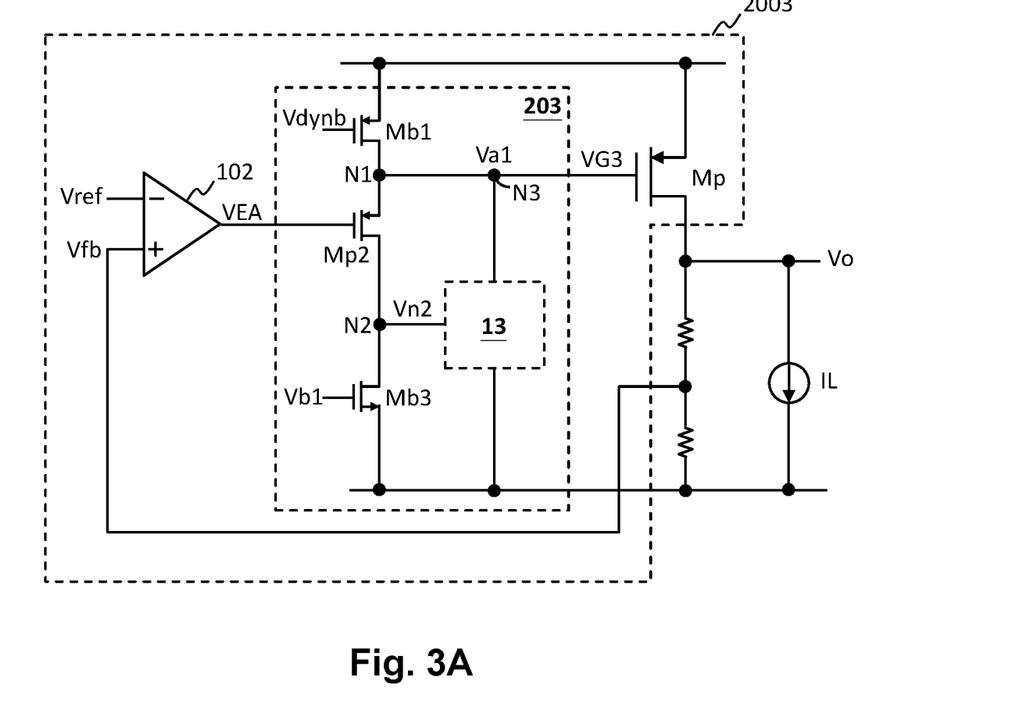
FIG. 3A shows a schematic diagram of an amplifier circuit having low parasitic pole effect according to an embodiment of the present invention.

Please refer to FIG. 3A. FIG. 3A shows a schematic diagram of an amplifier circuit having low parasitic pole effect according to an embodiment of the present invention (amplifier circuit 2003). The amplifier circuit 2003 of FIG. 3A is similar to the amplifier circuit 2002 in FIG. 2, and the buffer circuit 203 in FIG. 3A is a more specific embodiment of the buffer circuit 202 in FIG. 2. In one embodiment, the buffer circuit 203 is configured to generate a driving signal VG3 according to the pre-amplified signal VEA. The buffer circuit 203 includes: a buffer input transistor Mp2, a first amplifier transistor 13, a first current source circuit Mb1, and a third current source circuit Mb3. In one embodiment, the first current source circuit Mb1 and the third current source circuit Mb3 are configured to bias the buffer input transistor Mp2 according to the control signal Vdynb and the control signal Vb1, respectively.

In one embodiment, the buffer input transistor Mp2 is configured as a non-inverted follower. In the embodiment of FIG. 3A, the buffer input transistor Mp2 is a metal-oxide-semiconductor (MOS) transistor and configured as a source follower. In the present embodiment, the control end of the buffer input transistor Mp2 is controlled by the pre-amplified signal VEA, so as to generate the driving signal VG3 at a non-inverted output end N1 of the buffer input transistor Mp2 and to generate an inverted control signal Vn2 at an inverted output end N2 of the buffer input transistor Mp2. It should be noted that the definitions of "non-inverted" and "inverted" refer to whether a signal at the corresponding end changes in a non-inverted form or inverted form in response to a change of a signal at the control end. In one embodiment, the device size of the buffer input transistor Mp2 is configured to be less than the device size of the output transistor Mp, so that the gate capacitance of the buffer input transistor Mp2 is less than the gate capacitance of the output transistor Mp, so that the input impedance of the control end of the buffer input transistor Mp2 is less than the input impedance of the control end of the output transistor Mp. In one embodiment, the gate capacitance of the buffer input transistor Mp2 is far less than the gate capacitance of the output transistor Mp. For example, the gate capacitance of the buffer input transistor Mp2 is less than one hundred percent of the gate capacitance of the output transistor Mp.

Please continue referring to FIG. 3A; in one embodiment, the first amplifier transistor 13 is controlled by the inverted control signal Vn2 to generate a first amplified signal Va1 at an inverted output end N3 of the first amplifier transistor 13, and the first amplified signal Va1 is in an inverted form with respect to the input signal. In the present embodiment, since the non-inverted output end N1 of the buffer input transistor Mp2 has a smaller output resistance, and through a cascaded amplification of the first amplifier transistor 13 and the buffer input transistor Mp2, the output resistance at the inverted output end N3 of the first amplifier transistor 13 can be further reduced. To sum up, since the buffer input transistor Mp2 has a smaller gate capacitance, and the inverted output end N3 of the first amplifier transistor 13 has a smaller output resistance, the buffer circuit 203 can reduce the parasitic pole effect between the output end of the pre-amplifier 102 and the control end of the output transistor Mp.

Figure 3B:
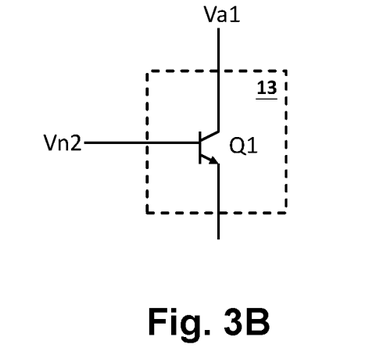
FIG. 3B and FIG. 3C show schematic diagrams of two embodiments of a first amplifier transistor in the amplifier circuit having low parasitic pole effect according to the present invention.
Figure 3C:
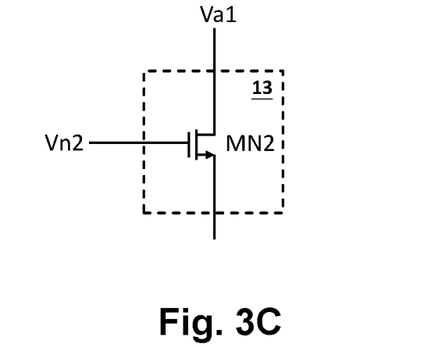

Please refer to FIG. 3B and FIG. 3C. FIG. 3B and FIG. 3C show schematic diagrams of two embodiments of the first amplifier transistor in the amplifier circuit having low parasitic pole effect according to the present invention. In one embodiment, the first amplifier transistor 13 in FIG. 3A can be configured as a BJT transistor (bipolar junction transistor) Q1 shown in FIG. 3B, or configured as a MOS transistor (metal-oxide-semiconductor transistor) MN2 shown in FIG. 3C. Specifically, when the first amplifier transistor 13 of FIG. 3A is configured as the BJT transistor Q1 of FIG. 3B, an equivalent impedance RVG3 of the control end of the output transistor Mp is as follows:

$$RVG3 \approx 1/[gmMp2(1+\beta)] \qquad \text{equation 1}$$

In equation 1, gmMp2 is substantially the transduction gain of the buffer input transistor Mp2, and β is substantially the current gain of the BJT transistor Q1. The equivalent impedance RVG3 of the control end of the output transistor Mp shown in equation 1 is less than the input impedance of the control end of the output transistor Mp when it is not adjusted by the buffer circuit 203.

On the other hand, when the first amplifier transistor 13 of FIG. 3A is configured as the MOS transistor MN2 of FIG. 3C, the equivalent impedance RVG3 of the control end of the output transistor Mp is as follows:

$$RVG3 \approx 1/(gmMp2*gmMN2*ro) \qquad \text{equation 2}$$

In equation 2, gmMN2*ro is substantially the amplification gain of the MOS transistor MN2. The equivalent impedance RVG3 of the control end of the output transistor Mp shown in equation 2 is less than the input impedance of the control end of the output transistor Mp when it is not adjusted by the buffer circuit 203.

Figure 4A:
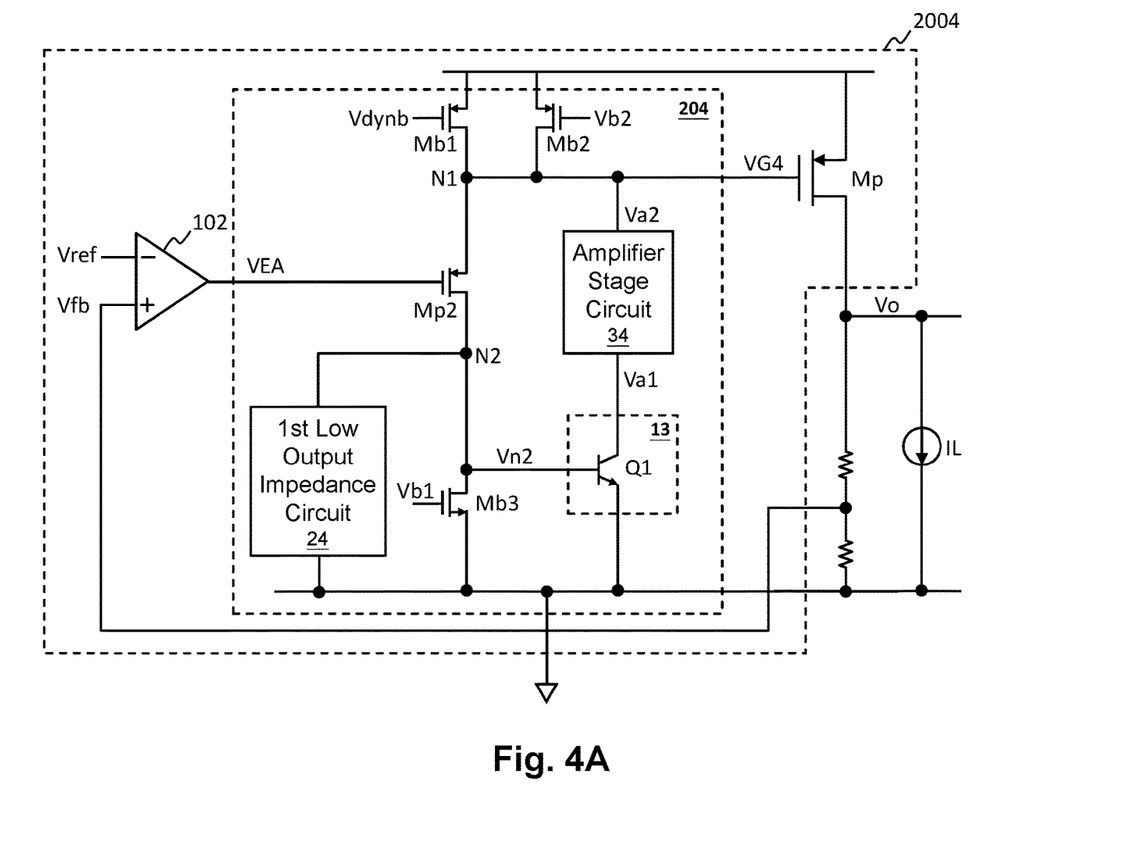
FIG. 4A shows a schematic diagram of an amplifier circuit having low parasitic pole effect according to an embodiment of the present invention.

Please refer to FIG. 4A. FIG. 4A shows a schematic diagram of an amplifier circuit having low parasitic pole effect according to an embodiment of the present invention (amplifier circuit 2004). The amplifier circuit 2004 of FIG. 4A is similar to the amplifier circuit 2003 of FIG. 3A, but with differences to be described below. In one embodiment, the buffer circuit 204 is configured to generate a driving signal VG4 according to the pre-amplified signal VEA. Compared with the buffer circuit 203, the buffer circuit 204 further includes a first low output impedance circuit 24, an amplifier stage circuit 34, and a second current source circuit Mb2. In one embodiment, the second current source circuit Mb2 is configured to bias the buffer input transistor Mp2 according to a control signal Vb2. In one embodiment, the first low output impedance circuit 24 is coupled to the inverted output end N2 of the buffer input transistor Mp2, wherein the output impedance of the first low output impedance circuit 24 is less than the inverted output impedance of the inverted output end N2 of the buffer input transistor Mp2, thereby reducing the parasitic pole effect of the inverted output end N2 of the buffer input transistor Mp2 and improving the system stability.

In one embodiment, the amplifier stage circuit 34 is configured to amplify the first amplified signal Va1 to generate a second amplified signal Va2, wherein the voltage of the first amplified signal Va1 and the voltage of the second amplified signal Va2 are in the same phase; a magnification ratio exists between the second amplified signal Va1 and the inverted control signal Vn2, and the second amplified signal Va2 is coupled to the driving signal VG, so that the equivalent output impedance of the non-inverted output end N1 of the buffer input transistor Mp2 is less than or equal to a product of an intrinsic output impedance of the non-inverted output end N1 of the buffer input transistor Mp2 and the reciprocal of the magnification ratio.

Figure 4B:
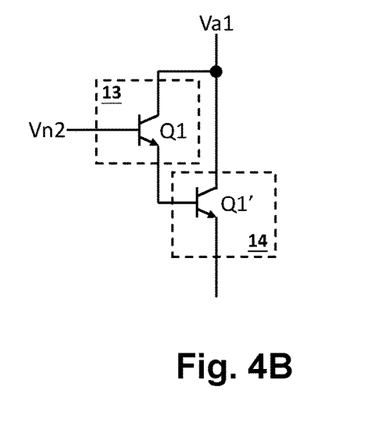
FIG. 4B and FIG. 4C show schematic diagrams of two embodiments showing coupling relationship of the first amplifier transistor and the second amplifier transistor in the amplifier circuit having low parasitic pole effect according to the present invention.
Figure 4C:
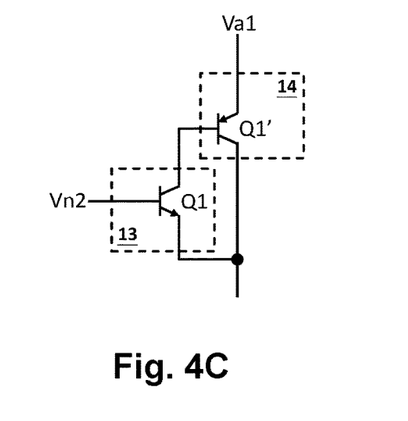

Please refer to FIGS. 4A to 4C. FIG. 4B and FIG. 4C show schematic diagrams of two embodiments showing coupling relationship of the first amplifier transistor and the second amplifier transistor in the amplifier circuit having low parasitic pole effect according to the present invention. In one embodiment, the buffer circuit 204 in the amplifier circuit 2004 further includes a second amplifier transistor 14. As shown in FIG. 4B and FIG. 4C, the second amplifier transistor 14 can be configured as a BJT transistor Q1', for example. In one embodiment, the BJT transistor Q1' and the BJT transistor Q1 are transistors of the same conductivity type as shown in FIG. 4B, and are coupled as a Darlington pair of the same type; in another embodiment, the BJT transistor Q1' and the BJT transistor Q1 are complementary conductive type transistors as shown in FIG. 4C, and are coupled as a hetero-Darlington pair. In FIG. 4B and FIG. 4C, the BJT transistor Q1' is configured to increase the current gain of the BJT transistor Q1.

Figure 5:
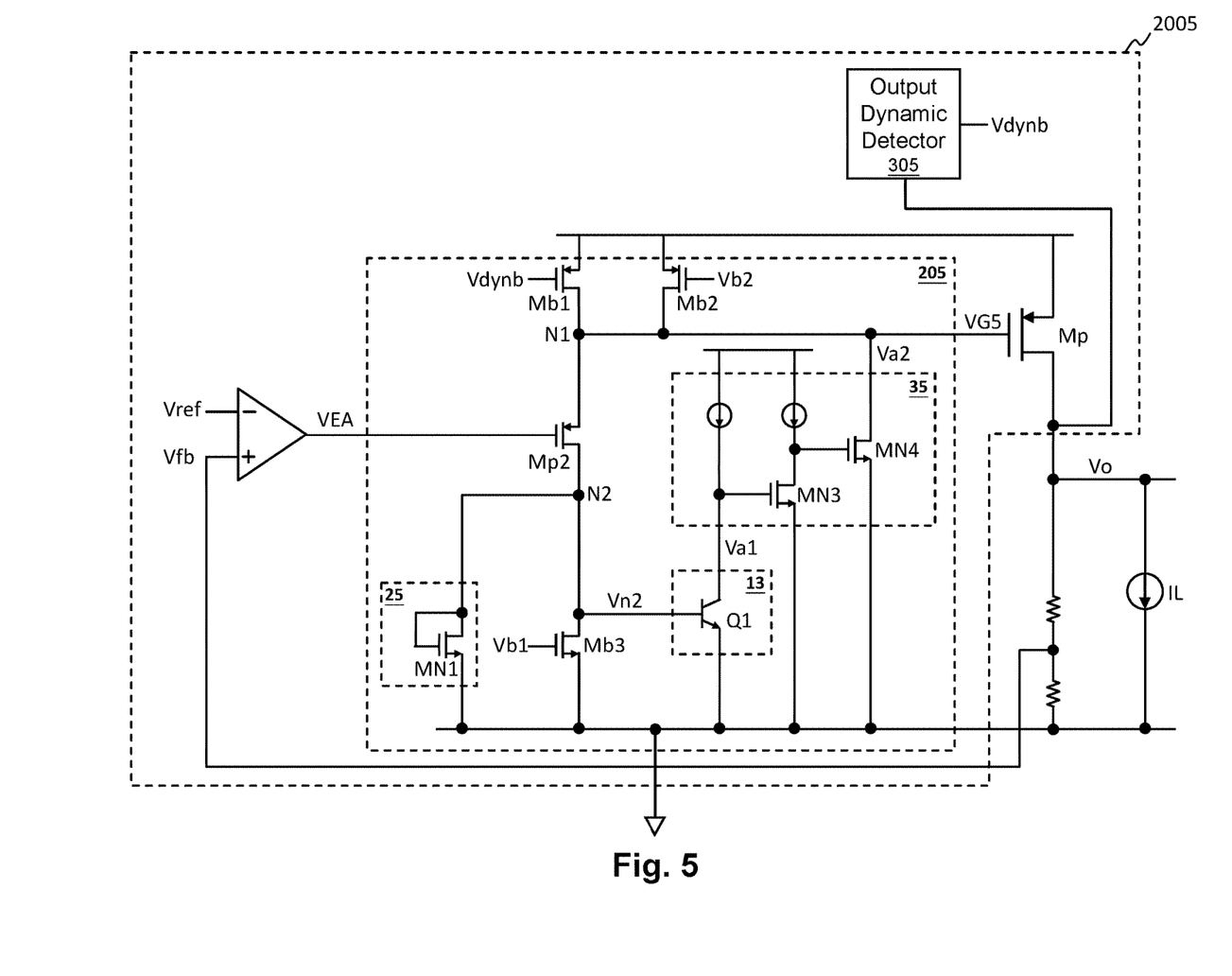
FIG. 5 shows a schematic diagram of an amplifier circuit having low parasitic pole effect according to an embodiment of the present invention.

Please refer to FIG. 5. FIG. 5 shows a schematic diagram of an amplifier circuit having low parasitic pole effect (amplifier circuit 2005) according to an embodiment of the present invention. The amplifier circuit 2005 of FIG. 5 is similar to the amplifier circuit 2004 of FIG. 4A, but is different in that, in this embodiment, the amplifier circuit 2005 further includes an output dynamic detector 305. In one embodiment, the buffer circuit 205 is configured to generate a driving signal VG5 according to the pre-amplified signal VEA. The buffer circuit 205 includes a first low output impedance circuit 25 which is configured as a transistor MN1 coupled as a diode. The buffer circuit 205 includes an amplifier stage circuit 35 which has an even number of inverted amplifier transistors connected in cascade with each other. In the embodiment of FIG. 5, the even number of inverted amplifier transistors connected in cascade with each other include transistors MN3 and MN4. In this embodiment, since the equivalent impedance of the transistor MN1 which is coupled as a diode is relatively lower, the parasitic pole effect at the inverted output end N2 of the buffer input transistor Mp2 can be greatly reduced, and the system stability can be improved.

As shown in FIG. 5, in one embodiment, the output dynamic detector 305 is configured to generate the control signal Vdynb according to a transient change of the output signal Vo, and the first current source circuit Mb1 adjusts the current level of the first current source circuit Mb1 according to the control signal Vdynb to speed up the transient response of the buffer circuit 205. In one embodiment, when the first current source circuit Mb1 adjusts the current level of the first current source circuit Mb1 to increase according to the control signal Vdynb, since the drain current of the transistor MN1 increases, the transduction gain of the transistor MN1 increases, so the output impedance of the first low output impedance circuit 25 is further reduced, thereby accelerating the transient response and improving the stability of the amplifier circuit having low parasitic pole effect during a transient state. In the embodiment of FIG. 5, the equivalent impedance RVG5 of the control end of the output transistor Mp is as follows:

$$RVG5 \approx 1/(gmMp2*gmQ1*ro*gmMN3*ro) \qquad \text{equation 3}$$

In equation 3, gmQ1*ro is substantially the amplification gain of the BJT transistor Q1, and gmMN3*ro is substantially the amplification gain of the transistor MN3. Compared with equation 1 or equation 2 (as described in the embodiment of FIG. 3A), the equivalent impedance RVG5 of the control end of the output transistor Mp shown in equation 3 is significantly reduced. It can be seen that through the cascaded amplification of the amplifier circuit 35, the equivalent impedance RVG5 of the control end of the output transistor Mp can be further reduced, thereby greatly reducing the parasitic pole effect and increasing the bandwidth.

Figure 6:
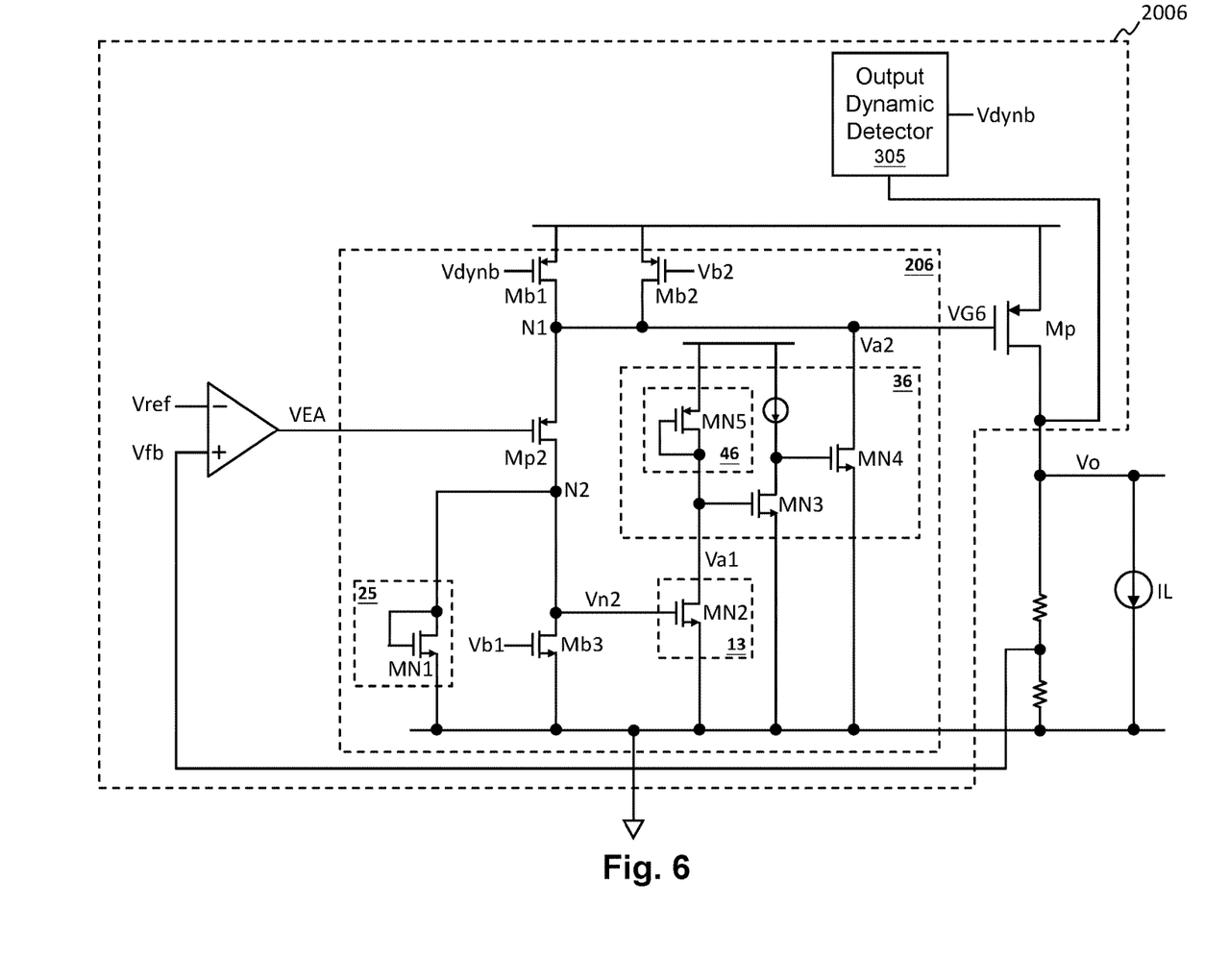
FIG. 6 shows a schematic diagram of an amplifier circuit having low parasitic pole effect according to an embodiment of the present invention.

Please refer to FIG. 6. FIG. 6 shows a schematic diagram of the amplifier circuit having low parasitic pole effect (amplifier circuit 2006) according to an embodiment of the present invention. The amplifier circuit 2006 of FIG. 6 is similar to the amplifier circuit 2005 of FIG. 5, but is different as described below. In this embodiment, the buffer circuit 206 is configured to generate a driving signal VG6 according to the pre-amplified signal VEA. In one embodiment, in the buffer circuit 206, the amplifier stage circuit 36 further includes a second low output impedance circuit 46, which is coupled to the inverted output end of the MOS transistor MN2, wherein the output impedance of the second low output impedance circuit 46 is less than the intrinsic output impedance of the inverted output end of the MOS transistor MN2 (the first amplifier transistor 13), thereby reducing the parasitic pole effect on the first amplified signal Va1. In one embodiment, the second low output impedance circuit 46 is a transistor MN5 coupled as a diode. In the embodiment of FIG. 6, the equivalent impedance RVG6 of the control end of the output transistor Mp is as follows:

$$RVG6 \approx 1/(gmMp2*gmMN3*ro)$$

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An amplifier circuit having low parasitic pole effect, comprising:
   a pre-amplifier, configured to generate a pre-amplified signal according to an input signal;
   an output transistor, configured to generate an output signal according to a driving signal applied to a control end of the output transistor; and
   a buffer circuit, configured to generate the driving signal according to the pre-amplified signal, wherein the buffer circuit comprises:
      a buffer input transistor, configured as a non-inverted follower, wherein a control end of the buffer input transistor is controlled by the pre-amplified signal to generate the driving signal at a non-inverted output end of the buffer input transistor and to generate an inverted control signal at an inverted output end of the buffer input transistor, and an input impedance of the control end of the buffer input transistor is less than an input impedance of the control end of the output transistor;
      a first low output impedance circuit coupled to an inverted output end of the buffer input transistor, wherein an output impedance of the first low output impedance circuit is less than an output impedance of the inverted output end of the buffer input transistor;

a first amplifier transistor controlled by the inverted control signal to generate a first amplified signal at an inverted output end of the first amplifier transistor; and an amplifier stage circuit, configured to amplify the first amplified signal to generate a second amplified signal, wherein a magnification ratio exists between the second amplified signal and the inverted control signal, wherein the second amplified signal is coupled to the driving signal, so that an equivalent output impedance of the non-inverted output end of the buffer input transistor is less than or equal to a product of an intrinsic output impedance of the non-inverted output end of the buffer input transistor and a reciprocal of the magnification ratio.

2. The amplifier circuit having low parasitic pole effect of claim 1, wherein a gate capacitance of the buffer input transistor is less than a gate capacitance of the output transistor.

3. The amplifier circuit having low parasitic pole effect of claim 2, wherein the gate capacitance of the buffer input transistor is less than one percent of the gate capacitance of the output transistor.

4. The amplifier circuit having low parasitic pole effect of claim 1, wherein the first low output impedance circuit is a transistor coupled as a diode.

5. The amplifier circuit having low parasitic pole effect of claim 1, wherein the first amplifier transistor is a metal-oxide-semiconductor (MOS) transistor or a bipolar junction transistor (BJT).

6. The amplifier circuit having low parasitic pole effect of claim 1, wherein the buffer circuit further comprises a second amplifier transistor, wherein the second amplifier transistor and the first amplifier transistor are of the same conductivity type or complementary conductivity types, and the first amplifier transistor and the second amplifier transistor are coupled as a Darlington pair of the same type or a hetero-Darlington pair.

7. The amplifier circuit having low parasitic pole effect of claim 1, wherein the amplifier stage circuit comprises an even number of inverted amplifier transistors connected in cascade with each other.

8. The amplifier circuit having low parasitic pole effect of claim 1, wherein the buffer circuit further comprises a second low output impedance circuit coupled to the inverted output end of the first amplifier transistor, and an output impedance of the second low output impedance circuit is less than an intrinsic output impedance of the inverted output end of the first amplifier transistor.

9. The amplifier circuit having low parasitic pole effect of claim 8, wherein the second low output impedance circuit is a transistor coupled as a diode.

10. The amplifier circuit having low parasitic pole effect of claim 1, wherein the buffer circuit further comprises a first current source circuit and a second current source circuit which are configured to bias the buffer input transistor, wherein the first current source circuit adjusts a current level of the first current source circuit according to a transient change of the output signal, so as to accelerate a transient response of the buffer circuit.

11. The amplifier circuit having low parasitic pole effect of claim 10, wherein when the first current source circuit adjusts the current level of the first current source circuit to increase according to the transient change of the output signal, the output impedance of the first low output impedance circuit is further reduced, thereby accelerating the transient response and improving a stability of the amplifier circuit having low parasitic pole effect during a transient state.

12. A buffer circuit for reducing the parasitic pole effect of an amplifier circuit, the buffer circuit being configured to generate a driving signal according to a pre-amplified signal generated by a pre-amplifier of the amplifier circuit, wherein the driving signal is configured to control a control end of an output transistor of the amplifier circuit to generate an output signal, wherein the buffer circuit comprises:

a buffer input transistor, configured as a non-inverted follower, wherein a control end of the buffer input transistor is controlled by the pre-amplified signal to generate the driving signal at a non-inverted output end of the buffer input transistor and to generate an inverted control signal at an inverted output end of the buffer input transistor, and an input impedance of the control end of the buffer input transistor is less than an input impedance of the control end of the output transistor;

a first low output impedance circuit coupled to an inverted output end of the buffer input transistor, wherein an output impedance of the first low output impedance circuit is less than an intrinsic output impedance of the inverted output end of the buffer input transistor;

a first amplifier transistor controlled by the inverted control signal to generate a first amplified signal at an inverted output end of the first amplifier transistor; and an amplifier stage circuit, configured to amplify the first amplified signal to generate a second amplified signal, wherein a magnification ratio exists between the second amplified signal and the inverted control signal, wherein the second amplified signal is coupled to the driving signal, so that an equivalent output impedance of the non-inverted output end of the buffer input transistor is less than or equal to a product of an intrinsic output impedance of the non-inverted output end of the buffer input transistor and a reciprocal of the magnification ratio.

13. The buffer circuit of claim 12, wherein a gate capacitance of the buffer input transistor is less than a gate capacitance of the output transistor.

14. The buffer circuit of claim 12, wherein the first low output impedance circuit is a transistor coupled as a diode.

15. The buffer circuit of claim 12, wherein the first amplifier transistor is a metal-oxide-semiconductor (MOS) transistor or a bipolar junction transistor (BJT).

16. The buffer circuit of claim 12, further comprising a second amplifier transistor, wherein the second amplifier transistor and the first amplifier transistor are of the same conductivity type or complementary conductivity types, and the first amplifier transistor and the second amplifier transistor are coupled as a Darlington pair of the same type or a hetero-Darlington pair.

17. The buffer circuit of claim 12, wherein the amplifier stage circuit comprises an even number of inverted amplifier transistors connected in cascade with each other.

18. The buffer circuit of claim 12, further comprising a second low output impedance circuit coupled to the inverted output end of the first amplifier transistor, wherein an output impedance of the second low output impedance circuit is less than an intrinsic output impedance of the inverted output end of the first amplifier transistor.

19. The buffer circuit of claim 12, further comprising a first current source circuit and a second current source circuit which are configured to bias the buffer input transistor, wherein the first current source circuit adjusts a current level of the first current source circuit according to a transient change of the output signal, so as to accelerate a transient response of the buffer circuit.

\* \* \* \* \*